US010361147B1

(12) United States Patent
Xu et al.

(10) Patent No.: US 10,361,147 B1
(45) Date of Patent: Jul. 23, 2019

(54) INVERTER POWER MODULE LEAD FRAME WITH ENHANCED COMMON SOURCE INDUCTANCE

(71) Applicant: FORD GLOBAL TECHNOLOGIES, LLC, Dearborn, MI (US)

(72) Inventors: Zhuxian Xu, Novi, MI (US); Nevin Altunyurt, Atlanta, GA (US); Chingchi Chen, Ann Arbor, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 0 days.

(21) Appl. No.: 16/021,156

(22) Filed: Jun. 28, 2018

(51) Int. Cl.
| | |
|---|---|
| *H01L 23/495* | (2006.01) |
| *H02M 7/00* | (2006.01) |
| *H01L 23/00* | (2006.01) |
| *H01L 23/367* | (2006.01) |

(52) U.S. Cl.
CPC ...... *H01L 23/49562* (2013.01); *H01L 23/367* (2013.01); *H01L 23/4952* (2013.01); *H01L 23/49575* (2013.01); *H01L 24/05* (2013.01); *H01L 24/06* (2013.01); *H01L 24/49* (2013.01); *H02M 7/003* (2013.01); *H01L 2224/05553* (2013.01); *H01L 2224/48247* (2013.01); *H01L 2924/13055* (2013.01); *H01L 2924/14252* (2013.01)

(58) Field of Classification Search
CPC .................................. H01L 23/49562
USPC ........................................ 257/675
See application file for complete search history.

(56) References Cited

U.S. PATENT DOCUMENTS

| | | | |
|---|---|---|---|
| 5,389,817 | A | 2/1995 | Imamura et al. |
| 6,922,048 | B2 | 7/2005 | Hayat-Dawoodi |
| 8,324,025 | B2 | 12/2012 | Saboco |
| 8,581,533 | B2 | 11/2013 | Hayashi et al. |
| 9,813,009 | B1 | 11/2017 | Xu et al. |
| 9,837,887 | B1 | 12/2017 | Zhou et al. |
| 9,994,110 | B2 | 6/2018 | Xu et al. |

(Continued)

FOREIGN PATENT DOCUMENTS

JP      5793059 B2    10/2015

OTHER PUBLICATIONS

Ichikawa et al., Modules for Hybrid Vehicle Motor Driving, Fuji Electric Review, vol. 55, No. 2, pp. 46-50, 2009.

(Continued)

*Primary Examiner* — Ajay Arora
(74) *Attorney, Agent, or Firm* — David B. Kelley; MacMillan, Sobanski & Todd, LLC (57) ABSTRACT

A power module has upper and lower transistor dies carried by a lead frame assembly. The assembly has a positive DC paddle for the upper die and an AC paddle for the lower die. An upper plate interconnects a second side of the upper die with the AC paddle, and a lower plate interconnects a second side of the lower die with a negative power bar. Current flowing via positive and negative power bars defines a power loop creating a main magnetic flux with a first direction in a central region and a return direction outside the central region. The upper and lower plates have outer edges having respective notches to concentrate respective portions of a return magnetic flux. Each die has a gate pad connected in a gate loop, wherein the gate loops each overlap a respective concentrated return flux thereby enhancing a common source inductance for each transistor.

14 Claims, 5 Drawing Sheets

(56) References Cited

U.S. PATENT DOCUMENTS

| | | | | |
|---|---|---|---|---|
| 10,141,254 | B1* | 11/2018 | Xu | H01L 23/49838 |
| 2011/0234215 | A1* | 9/2011 | Ausserlechner | G01R 15/20 |
| | | | | 324/244 |
| 2014/0131843 | A1* | 5/2014 | Balakrishnan | H02M 3/33507 |
| | | | | 257/666 |
| 2014/0145193 | A1 | 5/2014 | Kadoguchi et al. | |
| 2018/0056795 | A1 | 3/2018 | Xu et al. | |

OTHER PUBLICATIONS

Bo Yang and Jason Zhang, "Effect and utilization of common source inductance in synchronous rectification." Twentieth Annual IEEE Applied Power Electronics Conference and Exposition, 2005. APEC 2005, vol. 3 IEEE, 2005.

\* cited by examiner

INVERTER POWER MODULE LEAD FRAME WITH ENHANCED COMMON SOURCE INDUCTANCE

CROSS REFERENCE TO RELATED APPLICATIONS

Not Applicable.

STATEMENT REGARDING FEDERALLY SPONSORED RESEARCH

Not Applicable.

BACKGROUND OF THE INVENTION

The present invention relates in general to semiconductor switching devices in a power module for an inverter bridge, and, more specifically, to inverter drive systems for electrified vehicles using discrete switching devices in a power module with structures for enhancing a common source inductance.

Electric vehicles, such as hybrid electric vehicles (HEVs), plug-in hybrid electric vehicles (PHEVs), and battery electric vehicles (BEVs), use inverter-driven electric machines to provide traction torque. A typical electric drive system may include a DC power source (such as a battery pack or a fuel cell) coupled by contactor switches to a variable voltage converter (VVC) to regulate a main bus voltage across a main DC linking capacitor. An inverter is connected between the main buses and a traction motor in order to convert the DC bus power to an AC voltage that is coupled to the windings of the motor to propel the vehicle.

The inverter includes transistor switching devices (such as insulated gate bipolar transistors, IGBTs) connected in a bridge configuration with a plurality of phase legs. A typical configuration includes a three-phase motor driven by an inverter with three phase legs. An electronic controller turns the switches on and off in order to invert a DC voltage from the bus to an AC voltage applied to the motor. The inverter may pulse-width modulate the DC link voltage in order to deliver an approximation of a sinusoidal current output to drive the motor at a desired speed and torque. Pulse Width Modulation (PWM) control signals applied to the gates of the IGBTs turn them on and off as necessary so that the resulting current matches a desired current.

Common source inductance refers to an inductance shared by the main power loop (i.e., the drain-to-source or collector-to-emitter power output of the transistor) and the gate driver loop (i.e., gate-to-source or gate-to-emitter) in a power switching transistor. The common source inductance carries both the device output current (e.g., drain-to-source or collector-to-emitter current) and the gate charging/discharging current. A current in the output (i.e., the power loop) portion of the common source inductance modifies the gate voltage in a manner that reinforces (e.g., speeds up) the switching performance. For a switching bridge, the reduced switching time may be desirable since it may have an associated reduction in the energy consumed (i.e., lost) during the switching transition. Modeling of circuit voltages, currents, and switching operation can determine an optimal magnitude for the common source inductance.

The magnitude of the gate loop inductance and/or the power loop inductance and the degree of mutual coupling between them can be manipulated (e.g., enhanced) by selecting an appropriate layout and/or including added overlapping coils in PCB traces forming conductive paths to the transistor gates or emitters in order to obtain a desired common source inductance $L_{CSI}$. Examples are shown in U.S. patent application publications US2018/0152113A1, US2018/0159440A1, and US2018/0123478A1, and U.S. Pat. No. 9,994,110, each of which is incorporated herein by reference in its entirety.

The power modules typically generate a large amount of heat, so they are often attached to a coldplate (i.e., heatsink) for better thermal performance. Preferred materials for the coldplate include electrically conductive materials, such as aluminum or copper. When the power current flows through the power module, the time-varying magnetic flux of the power loop induces Eddy currents in the conductive coldplate. The Eddy currents create a magnetic field that opposes the original magnetic field from the power loop. The total magnetic flux is reduced, which lowers the effective inductances of the power loop. Consequently, the common source inductance can also be reduced by the Eddy currents, making it difficult to enhance the common source inductance as desired.

SUMMARY OF THE INVENTION

In one aspect of the invention, a power module comprises upper and lower transistor dies. A lead frame assembly has a positive DC paddle receiving one side of the upper die and extending to a positive power bar, an AC paddle receiving a first side of the lower die and extending to an AC power bar, a negative power bar located between the paddles, an upper plate interconnecting a second side of the upper die with the AC paddle, and a lower plate interconnecting a second side of the lower die with the negative power bar. Current flowing via the positive and negative power bars defines a power loop creating a main magnetic flux with a first direction in a central region within inner edges of the upper and lower plates and a return direction outside the central region. The upper and lower plates have respective outer edges each having a respective notch adapted to concentrate a respective portion of a return magnetic flux. Each die has a respective gate pad connected in a respective gate loop, wherein the gate loops each overlaps a respective concentrated return magnetic flux portion thereby enhancing a common source inductance.

The invention is shown herein in the form of a half-bridge (2-in-1) transfer-molded power module (TPM) employing a lead frame for supporting the transistor dies and for routing the electrical signals. The lead frame can be an assembly using one or more discrete frame elements with known features including die paddles, power bars, tie bars, plates, pads, lead pins, jumpers, and bonding wires, some of which may be soldered together. The invention is also applicable to other types of modules such as direct bond copper (DBC) modules, or modules with other numbers of transistors such as 1-in-1 or 6-in-1 power modules.

DETAILED DESCRIPTION OF PREFERRED EMBODIMENTS

Figure 1:
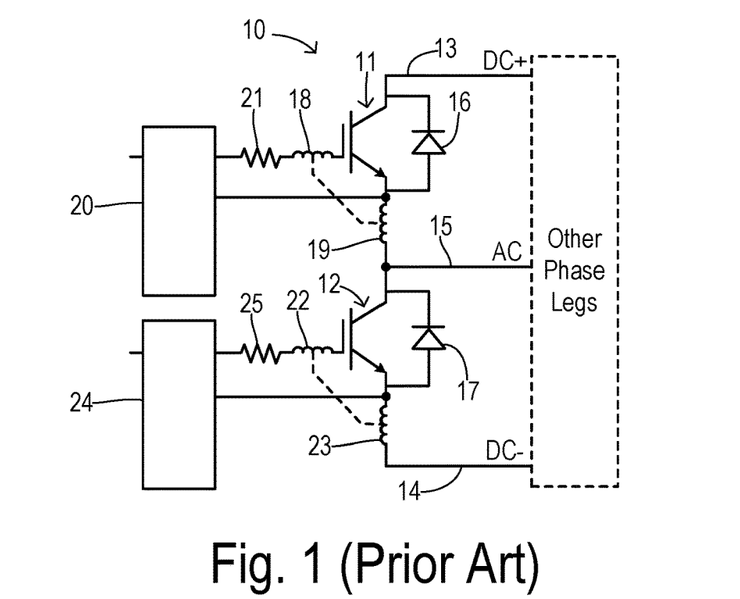
FIG. 1 is a schematic diagram showing an equivalent circuit for the inductances of a phase leg of an inverter having a pair of IGBTs.

Common source inductance is an inductance shared by a main power loop and a gate driver loop for a transistor switching device. It usually arises from parasitic inductances associated with the device packaging and traces on printed circuit boards. In the context of switching bridges used for DC to AC power conversion, the presence of common source inductance can be beneficial. FIG. 1 shows an example of a phase leg 10 of the type often used in an inverter drive system in an electrified vehicle for driving an electric motor, wherein an upper transistor 11 is shown as an IGBT with upper gate, collector, and emitter terminals. Other types of semiconductor devices could be used, such as a MOSFET. As used herein, the gate, collector, and emitter terminals of an IGBT also refer to gate, drain, and source terminals of a MOSFET. A lower transistor 12 has lower gate, collector, and emitter terminals is connected in series with upper transistor 11 between a positive bus 13 and a negative bus 14 to define an intermediate junction 15. Anti-parallel diodes 16 and 17 are connected across transistors 11 and 12.

The upper gate and emitter terminals create an upper common source inductance comprised of a gate loop inductance 18 magnetically coupled to a power loop (i.e., emitter-side) inductance 19. A gate drive circuit 20 and a gate resistor 21 are coupled to the gate terminal in order to control the switching of upper transistor 11. The lower gate and emitter terminals create a lower common source inductance comprised of a gate loop inductance 22 magnetically coupled to a power loop inductance 23. A gate drive circuit 24 and a gate resistor 25 are coupled to the gate terminal in order to control the switching of lower transistor 12.

Figure 2:
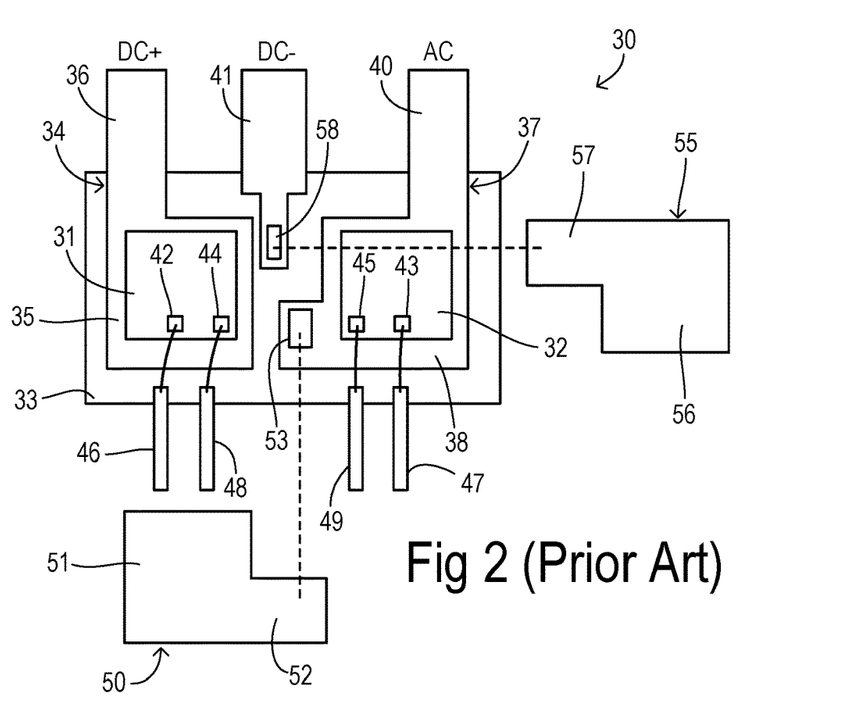
FIG. 2 is a partially-exploded, plan view of a transfer-molded power module (TPM) having a pair of IGBTs and a prior art electrode structure.
Figure 3:
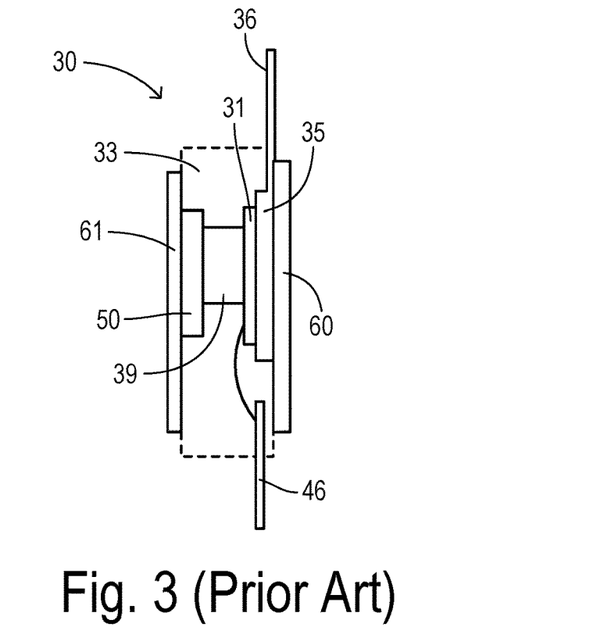
FIG. 3 is a side view of the transfer-molded power module (TPM) of FIG. 2.
Figure 4:
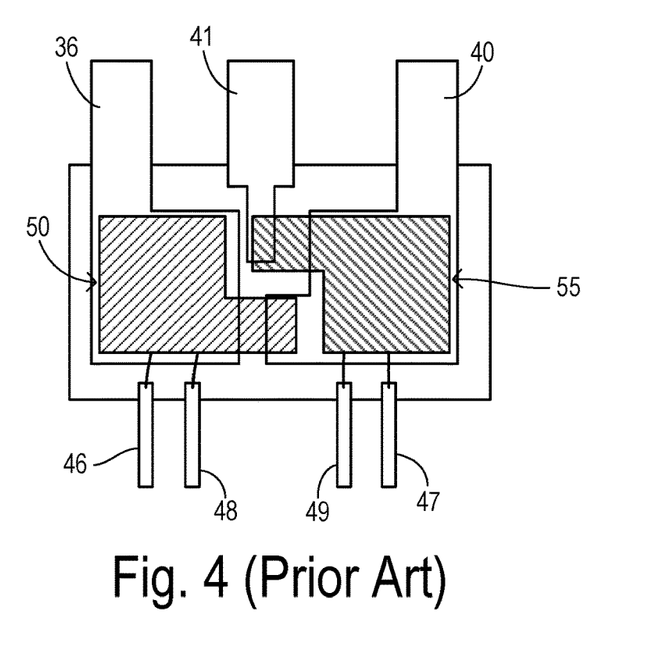
FIG. 4 is an unexploded, plan view of the transfer-molded power module (TPM) of FIG. 2.

FIGS. 2-4 show a transfer-molded power module (TPM) 30 with a normal (i.e., unenhanced) common source inductance. The 2-in-1 module carries a pair of upper and lower switching transistor dies 31 and 32 which are connected for implementing a phase leg of the inverter bridge. A lead frame assembly includes conductive traces or sections which can be obtained using one or more lead frame sheets with various two-dimensional and/or three-dimensional patterns, some of which may be removed either before or after encapsulating the module in a molded solid body 33 (which is partially broken away in FIG. 2). A first lead frame element 34 has a paddle 35 receiving one side (e.g., the collector side) of upper IGBT transistor die 31 and has a positive power bar 36 for connecting to the positive voltage bus (DC+). A second frame element 37 has a paddle 38 for receiving one side (e.g., the collector side) of lower IGBT transistor die 32 and has an AC power bar 40 for connecting to the AC output of the phase leg. A third frame element provides a negative power bar 41 for connecting to the negative voltage bus (DC−). Negative power bar 41 is physically located between frame elements 34 and 37.

Transistor dies 31 and 32 have a collector terminal or pad formed on their bottom surfaces which are soldered to paddles 35 and 38. The upper surfaces of dies 31 and 32 have gate terminals/pads 42 and 43 and emitter terminals/pads 44 and 45. Bonded wires connect pads 42-45 to upper gate pin 46, lower gate pin 47, upper Kelvin emitter pin 48, and lower Kelvin emitter pin 49 of the lead frame assembly, respectively. Conventional ultrasonic bonding of wires can be employed, for example. The lead frame assembly includes an upper plate 50 with an emitter section 51 electrically connected to the emitter side of die 31 and an extension 52 that is electrically connected to frame element 37. The electrical connection between extension 52 and frame element 37 can be facilitated by a jumper or copper spacer body 53. Similarly, a spacer body may be disposed between emitter section 51 and the emitter side of die 31 (e.g., body 39 in FIG. 3). The spacer provides better thermal dissipation capacity and also creates an open space over die 31 to accommodate the bonded wires. The lead frame assembly also includes a lower is plate 55 with an emitter section 56 electrically connected to the emitter side of die 32 and an extension 57 that is electrically connected to negative power bar 41. The electrical connection between extension 57 and negative power bar 41 can be facilitated by a jumper and/or solder body 58. Similarly, a jumper and/or solder body may be disposed between emitter section 56 and the emitter side of die 32. In FIG. 2, plates 50 and 55 are shifted laterally as shown by the dashed lines, and they are shown in their actual locations in FIG. 4. The side view of FIG. 3 shows coldplates 60 and 61 used for cooling module 30 as known in the art.

Figure 5:
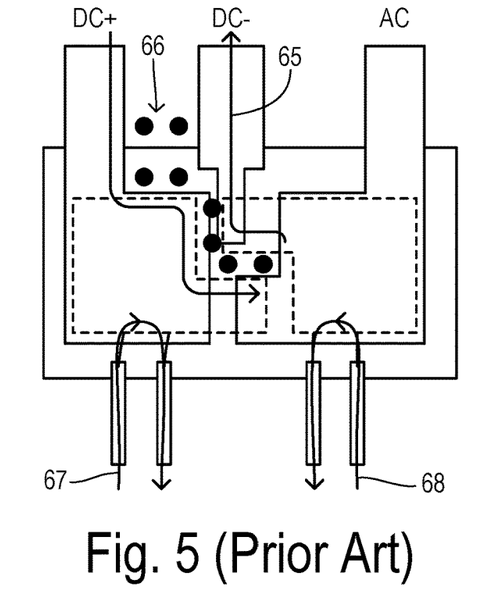
FIG. 5 is a plan view of the power module of FIG. 2 indicating a gate loop and a power loop associated without an enhanced common source inductance.

In the half-bridge power module layout of FIGS. 2-4, the power loop current flows from DC+ to DC− along a path 65 shown in FIG. 5. Although current in power bars 36 and 41 is not simultaneous, the overall current along path 65 induces a magnetic flux with high density within the power current loop as represented by dots 66. The direction of this main magnetic flux can be determined using right-hand rule. Dots 66 inside the current loop represent a main magnetic flux direction out from the page. The flux is mainly concentrated in a spatial region between the electrically conductive lead frame structures carrying the power loop current (i.e., flowing from power bar 36, through transistor die 31, upper plate 50, through transistor die 32, lower plate 55, and negative power bar 41). Gate loop currents 67 and 68 (from the gate pins, through the respective transistor dies, to the Kelvin emitter pins) share very little magnetic flux with main magnetic flux 66. Therefore, the mutual inductance (i.e., common source inductance) between the power loop and the gate loop is negligible.

As shown in publication US2018/0152113A1, the gate loops can be routed so that they encompass magnetic flux of the power loop in order to enhance the common source inductance. The re-routing of the gate loops can include forming an inductive loop in a lead frame, traces on an auxiliary circuit board, or shaped bonding wires for the connections to the gate terminal and/or Kelvin emitter terminal. The prior structures are arranged to couple the gate loop with the main magnetic flux inside the power loop, which has the highest flux density. When utilizing a power module with conductive coldplates, however, the Eddy currents induced in the coldplate(s) induce an opposing magnetic flux that reduces the main flux. Consequently, the enhancement of the common source inductance which depends on the main flux is likewise reduced. Modifications to the coldplates to reduce Eddy currents are costly and may reduce the thermal performance.

The invention utilizes a discovery that the return magnetic flux of the power loop (which is generally outside the power loop and in a direction opposite of the main flux) is relatively less affected by the Eddy currents. By adjusting the current flow of the power loop to concentrate a portion of the return magnetic flux and by coupling a gate loop to the concentrated return flux, the invention achieves an enhanced common source inductance even in the presence of Eddy currents.

FIGS. 6-9 show a transfer-molded power module (TPM) 70 with a pair of upper and lower switching transistor dies 71 and 72 which are connected for implementing a phase leg of the inverter bridge. A lead frame assembly includes conductive traces or sections which can be obtained using one or more lead frame sheets with various two-dimensional and/or three-dimensional patterns, some of which may be removed either before or after encapsulating the module in a molded solid body 73. A first lead frame element 74 has a paddle 75 receiving one side (e.g., the collector side) of upper IGBT transistor die 71 and has a positive power bar 76 for connecting to the positive voltage bus (DC+). A second frame element 77 has a paddle 78 for receiving one side (e.g., the collector side) of lower IGBT transistor die 72 and has an AC power bar 80 for connecting to the AC output of the phase leg. A third frame element provides a negative power bar 81 for connecting to the negative voltage bus (DC−). Negative power bar 41 is physically located between frame elements 74 and 77 (so that the main magnetic flux of the power loop is generally between dies 71 and 72 and between power bars 76 and 81).

Figure 6:
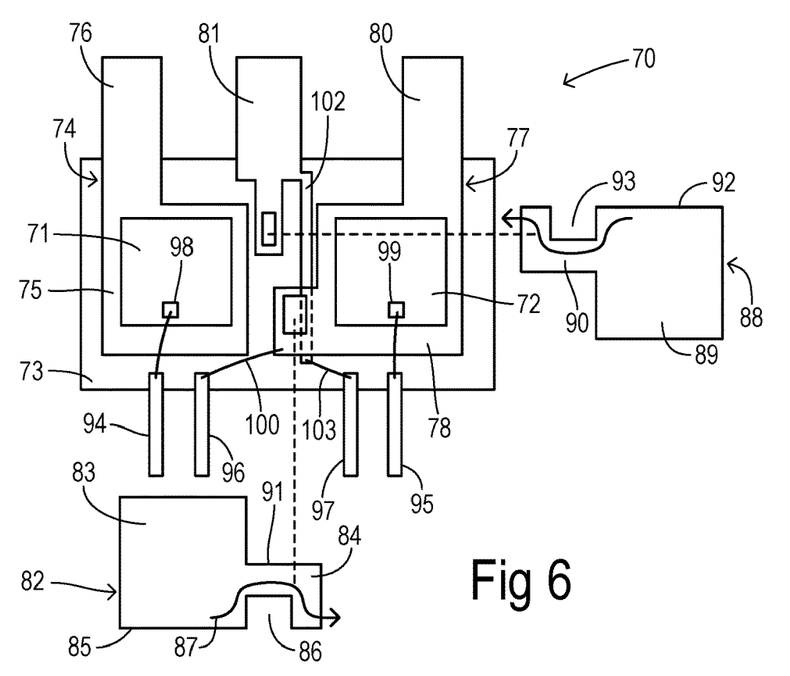
FIG. 6 is a partially exploded, plan view of a transfer-molded power module (TPM) according to the invention with an enhanced common source inductance in which the gate loops are coupled to a return magnetic flux of the power loop.

The lead frame assembly includes an upper plate 82 with an emitter section 83 electrically connected to the emitter side of die 71 and an extension 84 that is electrically connected to frame element 77. The electrical connection between extension 84 and frame element 77 can be facilitated by a jumper and/or solder body. The lead frame assembly also includes a lower plate 89 with an emitter section 88 electrically connected to the emitter side of die 72 and an extension 90 that is electrically connected to negative power bar 81. The electrical connection between extension 90 and negative power bar 81 can be facilitated by a jumper and/or solder body. In FIG. 6, plates 82 and 88 are shifted laterally as shown by the dashed lines, and they are shown in their actual locations in FIG. 7.

Figure 7:
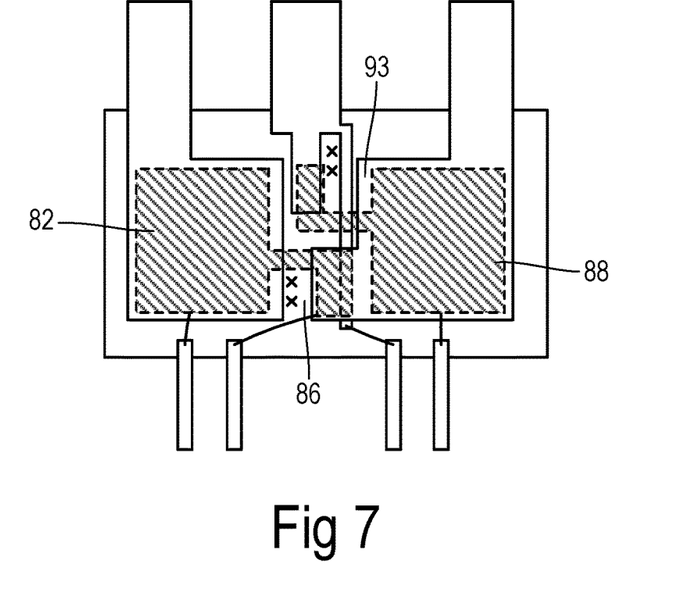
FIG. 7 is an unexploded, plan view of the transfer-molded power module (TPM) of FIG. 6.

The lead frames on the IGBT emitter side (i.e., AC for upper die 71 and DC− for lower die 72) incorporate special patterns (e.g., an open notch or slot) to create areas with high magnetic flux density outside the power loop current path. Thus, upper plate 82 has an outer edge 85 with a notch 86 such that some of the current flow along extension 84 follows a curved path 87. Outer edge 85 is an "outer" edge relative to the curved path followed by the main power loop current which induces the main magnetic flux along an inner edge 91 of upper plate 83. Curved path 87 induces a concentration of a portion of the return flux within notch 86. Likewise, lower plate 88 has an outer edge 92 with a notch 93 for concentrating a corresponding portion of the return flux within notch 93. FIG. 7 shows the concentrated return flux as X's located outside the central region of the main magnetic flux since the return magnetic flux in this example would be directed into the page.

In the illustrated embodiment, the Kelvin emitters of the IGBTs are re-routed so that each gate loop surrounds the high return magnetic flux area to create enhanced common source inductances. In a conventional layout, the Kelvin emitter pins are generally connected to the top surface of the IGBT chip through a bonded wire. In this embodiment of the invention, the Kelvin emitter pins are connected to the lead frame (e.g., the AC and DC− portions) such that the gate loop surrounds the concentrated return magnetic flux. Thus, the lead frame assembly includes an upper gate pin 94, a lower gate pin 95, an upper Kelvin emitter pin 96, and a lower Kelvin emitter pin 97. Gate pins 94 and 95 are connected by bonding wires to gate pads 98 and 99 on dies 71 and 72, respectively. Upper Kelvin emitter pin 96 is connected by a bonding wire 100 to frame element 77 (e.g., paddle 78) so that a resulting gate loop 101 (FIG. 8) overlaps the concentrated return flux of notch 86. In particular, the gate loop current includes the current that flows along curved path 87 along notch 86.

In order to locate a portion of the gate current loop for the lower transistor to overlap the concentrated return flux within notch 93 (which is closest to the opposite side of module 70 from the side having the gate and emitter pins), negative power bar 81 is provided with a lateral strip 102 which crosses the region of notch 93 to the side of the point on power bar 81 where extension 90 is connected. Lower Kelvin emitter pin 97 is connected by a bonding wire 103 to the end of strip 102 so that a resulting gate loop 104 (FIG. 8) overlaps the concentrated return flux of notch 93. Strip 102 may include a bend or slanted portion to avoid contacting other portions of the lead frame assembly such as frame element 77.

Figure 8:
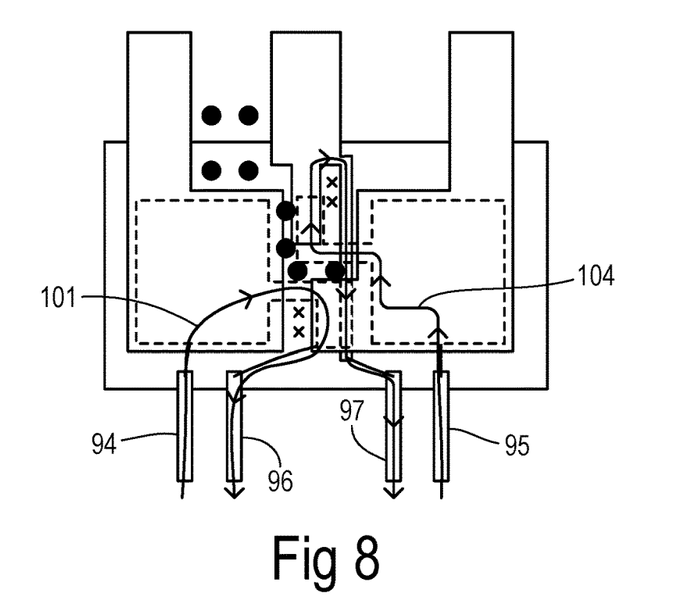
FIG. 8 is a plan view of the transfer-molded power module (TPM) of FIG. 6 indicating magnetic fluxes of the power loop and the current flow present in the gate loops.
Figure 9:
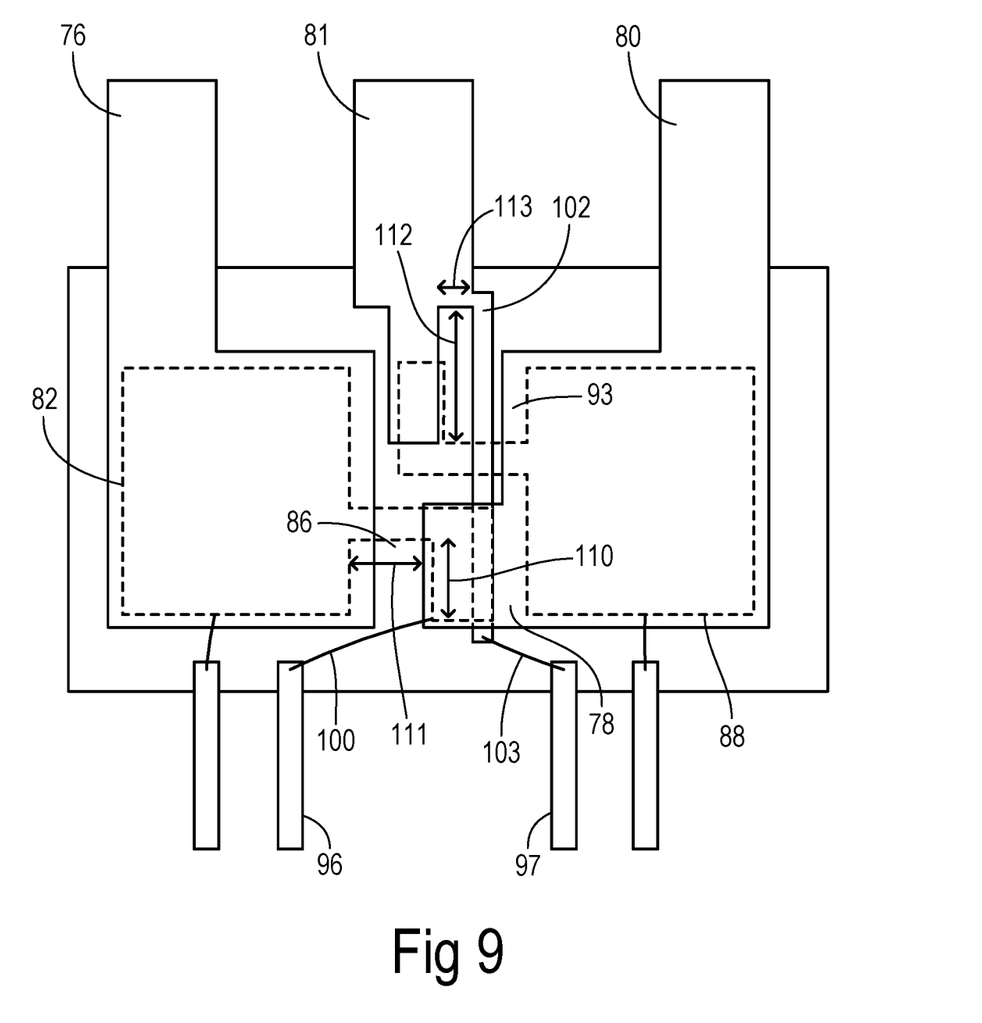
FIG. 9 is a plan view of the transfer-molded power module (TPM) of FIG. 6 indicating dimensional characteristics of the lead frame which can be adjusted to obtain a desired magnitude of the common source inductance.

As shown in FIG. 8, the main magnetic flux in the central region of the power loop is still present in the illustrated embodiment. Therefore, strong Eddy currents could still be induced in a coldplate spanning a lateral side of the power module. Nevertheless, the enhanced common source inductance of the invention is obtained by overlapping the gate loops with the return magnetic flux. The Eddy current loops induced in the coldplate and the resulting magnetic flux induced by the Eddy currents are offset from the gate loops, so that the impact on the enhanced common source inductance is small. In one particular construction of a power module, it was found that while the presence of a coldplate reduced by 80% the magnitude of a common source inductance that was enhanced by a gate loop that overlapped the fluxes of the central power loop and the Eddy currents, the enhanced common source inductance was only reduced 20% by the Eddy currents when the gate loop instead overlapped the return flux of the power loop.

In the illustrated embodiment, the physical dimensions of the gate loops can be easily adjusted by design in order to obtain a desired magnitude for the enhanced common source inductance. In particular, the effective size of the overlapping regions of the power loop concentrated return flux and the area of the gate loops are controlled by the dimensions shown in FIG. 9. The common source inductance for the upper transistor can be varied by changing a depth 110 of notch 86 and by changing a width 11 between one edge of notch 86 and the closest edge of paddle 78 (which bounds the area of current flow to Kelvin emitter pin 96). The common source inductance for the lower transistor can be varied by changing a depth 112 and a width 113 of a region contained within notch 93 and the loop within strip 102 and the main section of power bar 81.

What is claimed is:

1. A power module comprising;
   upper and lower transistor dies; and
   a lead frame assembly having a positive DC paddle receiving one side of the upper die and extending to a positive power bar, an AC paddle receiving a first side of the lower die and extending to an AC power bar, a negative power bar located between the paddles, an upper plate interconnecting a second side of the upper die with the AC paddle, and a lower plate interconnecting a second side of the lower die with the negative power bar;
   wherein current flowing via the positive and negative power bars defines a power loop creating a main magnetic flux with a first direction in a central region within inner edges of the upper and lower plates and an opposing direction outside the central region;
   wherein the upper and lower plates have respective outer edges each having a respective notch adapted to concentrate a respective portion of a return magnetic flux; and
   wherein each die has a respective gate pad connected in a respective gate loop, wherein the gate loops each overlaps a respective concentrated return magnetic flux portion, thereby enhancing a common source inductance.

2. The power module of claim 1 wherein the dies each include a respective emitter pad, wherein the lead frame assembly includes a respective gate pin and an emitter pin for each die, and wherein the respective gate pins and emitter pins are connected to the gate pads and emitter pads so that a gate loop current for each die flows along the respective notch.

3. The power module of claim 2 wherein a bond wire connects the emitter pin for the upper die to the AC paddle.

4. The power module of claim 2 wherein the negative power bar includes a lateral strip crossing the notch in the lower plate, and wherein a bond wire connects the emitter pin for the lower die to the lateral strip.

5. The power module of claim 1 wherein the transistors dies are comprised of insulated gate bipolar transistors (IGBTs), and wherein the first sides are collector sides of the IGBTs.

6. The power module of claim 1 further comprising at least one coldplate spanning a lateral side of the power module, wherein an eddy current loop induced in the coldplate by the main magnetic flux is offset from the gate loops.

7. A power converter comprising:
   a DC link with positive and negative buses configured to receive a DC supply voltage;
   a plurality of half-bridge power modules coupled between the buses, each power module comprising:
   upper and lower transistor dies; and
   a lead frame assembly having a positive DC paddle receiving one side of the upper die and extending to a positive power bar, an AC paddle receiving a first side of the lower die and extending to an AC power bar, a negative power bar located between the paddles, an upper plate interconnecting a second side of the upper die with the AC paddle, and a lower plate interconnecting a second side of the lower die with the negative power bar;
   wherein current flowing via the positive and negative power bars defines a power loop creating a main magnetic flux with a first direction in a central region within inner edges of the upper and lower plates and an opposing direction outside the central region;
   wherein the upper and lower plates have respective outer edges each having a respective notch adapted to concentrate a respective portion of a return magnetic flux; and
   wherein each die has a respective gate pad connected in a respective gate loop, wherein the gate loops each overlaps a respective concentrated return magnetic flux portion, thereby enhancing a common source inductance.

8. The power converter of claim 7 wherein the dies in each power module each include a respective emitter pad, wherein the lead frame assemblies include a respective gate pin and an emitter pin for each die, and wherein the respective gate pins and emitter pins are connected to the gate pads and emitter pads so that a gate loop current for each die flows along the respective notch.

9. The power converter of claim 8 wherein a bond wire connects the emitter pin for the upper die of each power module to the respective AC paddle.

10. The power converter of claim 8 wherein the negative power bar of each power module includes a lateral strip crossing the notch in the respective lower plate, and wherein a bond wire connects the respective emitter pin for the lower die to the lateral strip.

11. The power converter of claim 7 wherein the transistors dies are comprised of insulated gate bipolar transistors (IGBTs), and wherein the first sides are collector sides of the IGBTs.

12. The power converter of claim 7 wherein each power module further comprises at least one coldplate spanning a lateral side of the respective power module, wherein an eddy current loop induced in the coldplate by the main magnetic flux is offset from the gate loops.

13. An inverter power module comprising;
    upper and lower transistor dies; and
    a lead frame assembly connecting the dies in a half-bridge and defining a power loop including upper and lower plates connected to emitter sides of the dies;
    wherein the plates each include a perimeter notch concentrating a return flux outside the power loop;
    wherein the frame assembly further comprises gate loops for each die coupling to a respective one of the return fluxes.

14. The power module of claim 13 wherein the frame assembly further comprises a positive DC paddle receiving a collector side of the upper die and extending to a positive power bar, an AC paddle receiving a collector side of the lower die and extending to an AC power bar, a negative power bar located between the paddles;
    wherein the upper plate interconnects the emitter side of the upper die with the AC paddle;
    wherein the lower plate interconnects the emitter side of the lower die with the negative power bar; and
    wherein current flowing via the positive and negative power bars creates a main magnetic flux of the power loop within inner edges of the upper and lower plates.

* * * * *